US006869295B2

(12) United States Patent
Hein et al.

(10) Patent No.: US 6,869,295 B2
(45) Date of Patent: Mar. 22, 2005

(54) ELECTRICAL CONNECTION GROUNDING ELEMENT FOR USE WITH A PRINTED CIRCUIT BOARD AND AN ELECTRONIC EQUIPMENT CHASSIS

(75) Inventors: Gerald K. Hein, Pullman, WA (US); Donald Borowski, Spokane, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 10/645,015

(22) Filed: Aug. 21, 2003

(65) Prior Publication Data

US 2005/0042891 A1 Feb. 24, 2005

(51) Int. Cl.[7] .......................... H01R 4/66; H01R 13/648
(52) U.S. Cl. .......................................... 439/95; 439/947
(58) Field of Search ............................ 439/95–97, 101, 439/108, 947

(56) References Cited

U.S. PATENT DOCUMENTS

| 4,632,476 A | * | 12/1986 | Schell ........................... 439/95 |
| 5,513,996 A | * | 5/1996 | Annerino et al. .............. 439/95 |
| 5,647,748 A | * | 7/1997 | Mills et al. .................... 439/81 |
| 5,747,735 A | * | 5/1998 | Chang et al. .................. 174/51 |
| 5,833,480 A | * | 11/1998 | Austin ........................... 439/95 |
| 6,077,095 A | * | 6/2000 | DelPrete et al. .............. 439/92 |
| 6,215,674 B1 | * | 4/2001 | Bertolami .................... 361/807 |
| 6,746,254 B2 | * | 6/2004 | Hooper ......................... 439/95 |

FOREIGN PATENT DOCUMENTS

DE 3638230 A1 * 5/1988 ............ H05K/7/14

* cited by examiner

Primary Examiner—Hae Moon Hyeon
(74) Attorney, Agent, or Firm—Cook, Alex, McFarron, Manzo, Cummings & Mehler, Ltd.

(57) ABSTRACT

The connection element includes a plurality of spring contact assemblies for receiving and making electrical contact with printed circuit boards inserted thereinto, respectively wherein the connection element is configured to mate between a side wall portion of the equipment chassis and an end cover thereof, which are secured together with said connection element captured therebetween, wherein insertion of a printed circuit board into a spring contact assembly results in an electrical ground connection between a circuit ground on the circuit board and the equipment chassis.

15 Claims, 3 Drawing Sheets

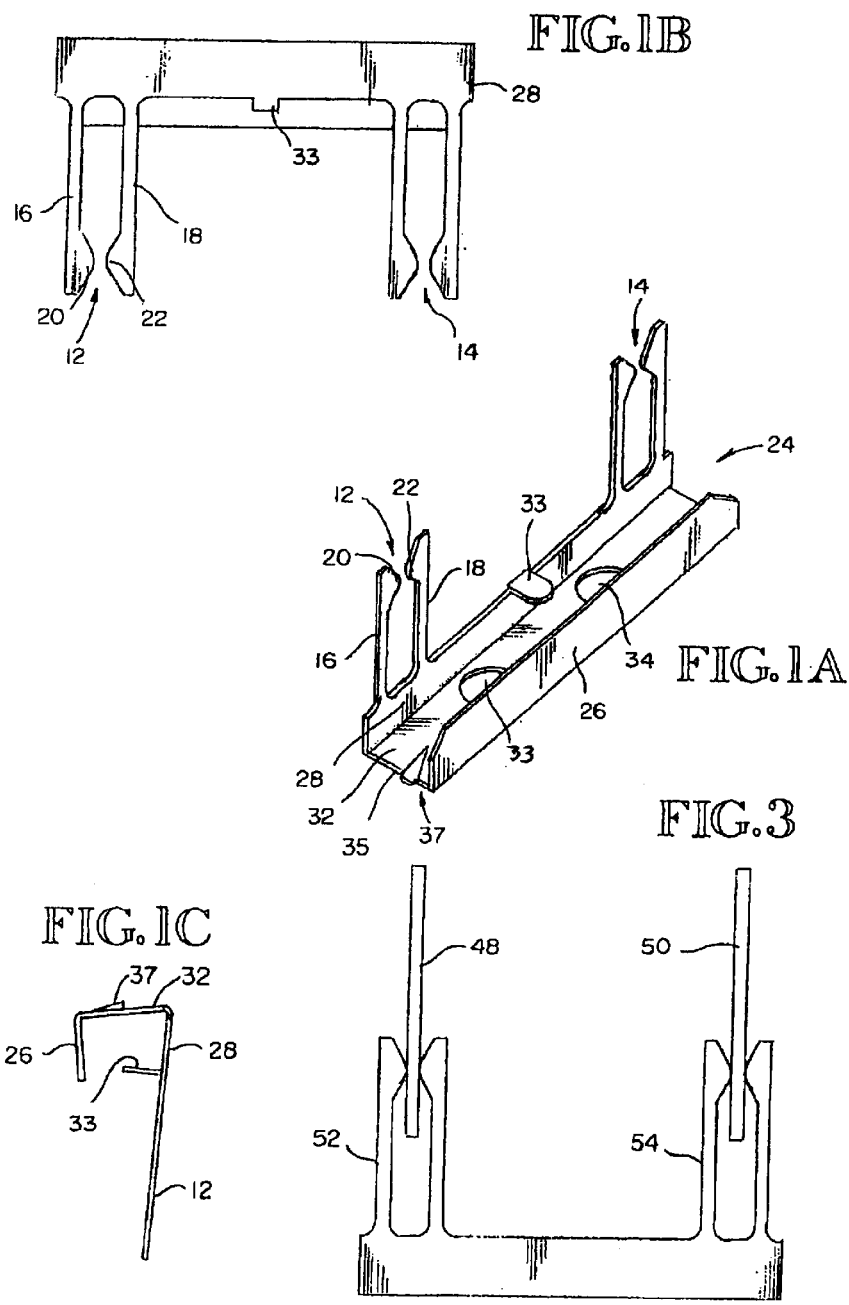

US 6,869,295 B2

ELECTRICAL CONNECTION GROUNDING ELEMENT FOR USE WITH A PRINTED CIRCUIT BOARD AND AN ELECTRONIC EQUIPMENT CHASSIS

TECHNICAL FIELD

This invention relates generally to grounding connections between a printed circuit board and the chassis of electronic equipment, and more specifically concerns a ground connector which results in a reliable electrical connection therebetween a circuit board inserted into the connector and the equipment chassis.

BACKGROUND OF THE INVENTION

It is well known that ground loops produced by various causes can contribute to electromagnetic compatibility (EMC) test failure of electrical circuits on integrated circuit boards used in electronic instruments. Further, with respect to EMC, when a ground-referenced signal is brought onto a particular board that is not well grounded, the board's circuit ground can become "hot" with the ground-reference signal, which in turn produces electromagnetic radiation.

Any resulting electromagnetic compatibility (EMC) test failures are undesirable. Electromagnetic compatibility (EMC) is generally understood to mean the ability of an electrical/electronic device to function properly in its normal operating context without interfering with the operation of other electrical/electronic devices.

Various solutions have been developed to help solve the above-noted EMC problems. In one of the solutions, integrated circuit boards are mounted to a conductive tray member which provides a conductive path to the equipment chassis through a plurality of electronically conductive standoff elements. The standoff elements are typically evenly distributed on the tray for short grounding paths. However, the tray/standoff approach is not particularly desirable when easy access to the circuit boards is required. Further, it is desirable that the circuit boards can slide out of the chassis conveniently without requiring use of a special tool, which is not the case with the tray/standoff structure.

In another solution, the printed circuit cards containing the electrical currents are electrically grounded to the instrument chassis through a back plane connector. In such an electrical grounding path arrangement, however, the circuit card is typically not directly connected to the equipment chassis and usually the ground path is relatively long. A direct, and short, electrical path from the circuit ground element to the chassis is important to satisfy the EMC requirements.

SUMMARY OF THE INVENTION

Accordingly, the present invention is an electrical connection element for providing a ground connection between a printed circuit board and an electronic equipment chassis, comprising: a connector element having at least one spring contact assembly for removably receiving and holding a printed circuit board inserted there into, such that the circuit board can be inserted and removed by hand, wherein the connection element includes a portion thereof which is configured to be directly attached to the electronic equipment chassis, and wherein insertion of the printed circuit board into the spring contact assembly results in a direct electrical connection between a circuit ground on the printed circuit board and the equipment chassis when the connection element is operatively attached to the equipment chassis.

BRIEF DESCRIPTION OF THE DRAWING

FIGS. 1A–1C show a first embodiment of the ground connection element of the present invention.

FIG. 3 is an end view showing the ground connection element 4 with FIGS. 1A, 1B, 1C circuit card inserted.

BEST MODE FOR CARRYING OUT THE INVENTION

Figure 2A:
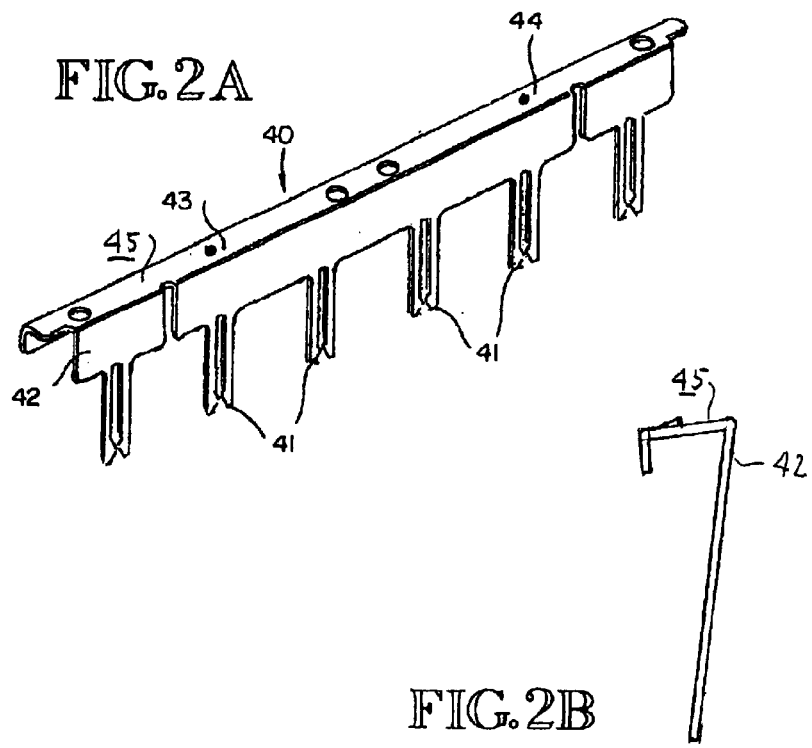
FIGS. 2A–2C show a second embodiment of the ground connection element of the present invention.

The present invention is an electrical connection element which is permanently attached to the chassis of an electronic instrument and includes at least one spring contact member, generally in the form of a tuning fork, which is arranged and configured to make a direct electrical connection to a conductive pad portion on a printed circuit board for electrical connection between a circuit ground which is connected to the conductive pad on the circuit board assembly and the connection element. Other spring contact configurations are also possible including, for instance, various leaf spring configurations.

FIGS. 1A–1C show a first embodiment of the present invention. In FIGS. 1A and 1C, the connection element includes two "tuning fork" spring contacts 12 and 14. Each such spring contact includes two spaced, elongated, upstanding portions 16 and 18 with small ear portions 20 and 22 at the top end thereof, which extend toward each other. The distance between the two ear portions in the embodiment shown is approximately 1 mm, designed to ensure appropriate contact pressure against a printed circuit board when it is inserted thereinto.

In the embodiment shown, the length of each spring contact is approximately 12 mm, although this can be varied. The spring contacts are made from electrically conductive material such as stainless steel and are approximately 0.25 mm thick, like the rest of the connector element. The spring contacts thus have some side-to-side spring action, allowing the two portions of each spring contact to be slightly spread apart to receive a printed circuit board, but then tending to spring back, to contact the printed circuit board firmly. The spring contacts 12 and 14 extend from one longitudinal edge of a trough portion 24. In the embodiment shown, trough portion 24 is approximately 31 mm long and 7 mm wide. One longitudinal side member of the trough portion, shown at 26, extends for the length of the trough and is approximately 5 mm high. The corners of longitudinal side 26 are cut away, i.e. beveled.

The opposing longitudinal side member 28 also extends for the length of trough portion 24. However, longitudinal side member 28 angles inwardly of the trough, approximately 10°, although this can be varied somewhat. The spring contacts 12 and 14 extend from the upper edge of longitudinal side member 28, also at a 10° angle. This angled arrangement is referred to as a "preload" bend, which tends to press the spring contacts against the side wall of the chassis or the card guide to which the connection element is attached. This arrangement ensures that the spring contacts are located properly relative to the conductive pad on the printed circuit board assembly and minimizes the possibility of damage to the printed circuit board or the spring contacts. This arrangement also results in a shorter electrical path from the printed circuit board to the chassis when the side wall is electrically conductive.

A bottom member 32 of trough 24 has two openings 33 and 34 therein. The use of the openings will be more fully explained below.

Approximately midway along longitudinal side member 28 is a short center tab 33 which extends inwardly of trough 24 approximately 3 mm. Center tab 33 is inserted into a slot or hole in the chassis and is used for locating the connection element to the chassis side wall, to ensure that the spring contacts are aligned with the circuit board.

Also, in bottom member 32 near one end 35 thereof is a lance portion 37 or, alternatively, a dimple which is used to produce a reliable high pressure point of contact between the connection element and the instrument chassis.

Figure 2B:
Figure 2C:
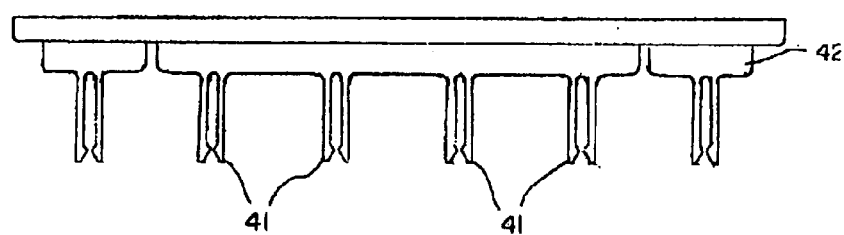

FIGS. 2A–2C show a modified version of the connection element of the present invention. FIGS. 2A–2C show a trough portion 40 with a plurality of spring contacts 41, each in the shape of a tuning fork (or similar configuration) extending upwardly from one longitudinal side 42 of the trough. The longitudinal side and the spring contacts, like that for FIGS. 1A–1C, angle inwardly of the trough member, again approximately 10%. In this embodiment, two spaced dimples, approximately 0.5 mm high, shown at 43 and 44, on the bottom surface 45 of trough portion 40, are used to produce the desired electrical contact between the connection element and the equipment chassis. In the embodiment of FIGS. 2A–2C, the spring contacts are somewhat longer than those in the embodiment of FIGS. 1A–1C. The connection element is also substantially longer, being 151 mm instead of 31 mm. The connection element of FIGS. 2A–2C is arranged to accommodate a total of six printed circuit boards, but this number can be varied.

The different arrangements of FIGS. 1A, 1B and 1C, and FIGS. 2A, 2B and 2C, respectively, illustrate that the connection element of the present invention can be made in various sizes, accommodating different numbers of inserted circuit boards. Hence, the present invention is not limited to a particular configuration such as shown in either FIGS. 1A–1C or FIGS. 2A–2C.

FIG. 3 is a simplified view showing the insertion of the circuit cards in the connection element of FIGS. 1A–1C. The printed circuit boards 48 and 50 are simply directly inserted into the tuning fork spring contacts 52 and 54. The printed circuit boards need not be inserted all the way to the bottom of the spring contacts.

Figure 4:
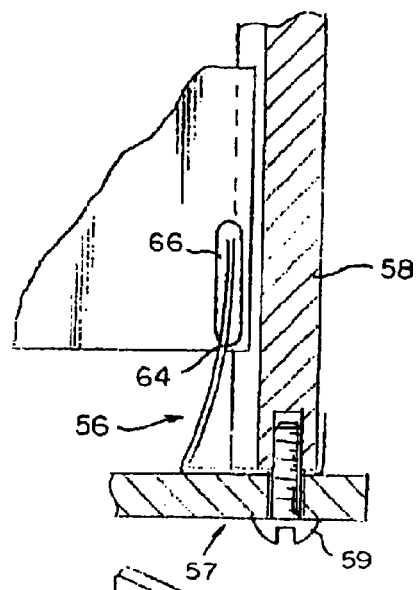
FIG. 4 is a side elevational, partial cross-sectional view showing the attachment of the connection element to the equipment chassis.

FIG. 4 shows one way of attaching the connection element of the present invention to the equipment chassis. In this arrangement, connection element 56 is positioned between the equipment side wall 58 and the end cover 57 of the chassis. The side wall 58 basically fits into the trough portion of the connection element between the respective longitudinal sides. In the embodiment shown, the connection element is thus "sandwiched" between the side wall and end cover, which are then bolted together conventionally by means of a series of bolts 59, with the bolts extending through openings 33, 34 in the bottom portion of the trough. In this arrangement, the connection element is located at the bottom of the equipment assembly, where it is protected from inadvertent damage. Each of the spring contacts 64 receives the leading edge of the printed circuit board as it is inserted into the instrument. The exposed conductive pad 66 on the printed circuit board, electrically connected to the circuit ground thereon, is positioned so that it makes electrical contact with the spring contacts, in particular the ear portions (not shown in FIG. 4) thereof.

Figure 5:
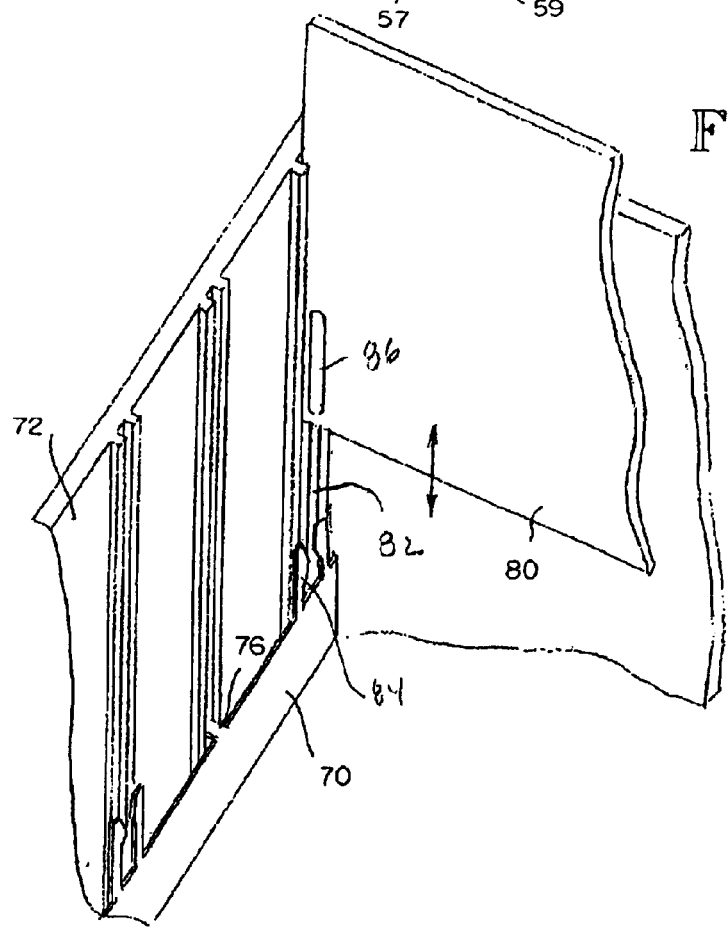
FIG. 5 is a perspective view showing the insertion of a printed circuit card into a connector element mounted in an equipment chassis.

FIG. 5 shows a connection element 70, like that shown in FIGS. 1A–1C, properly installed between side wall 72 of an electronic instrument and an end wall. Center tab 76 fits into a slot 78 in side wall 72, which results in the connection element 70 being properly located. The circuit board 80 is then inserted into a card guide 82 which is in registry with one of the spring contacts 84, until electrical contact is made between the electrically conductive pad 86 on the circuit board 80 and the spring contacts 84.

Hence, in the present invention, a reliable electrical connection is made between a circuit ground on a printed circuit board and the chassis of the electronic equipment, thereby reducing or eliminating ground loops for that particular circuit board.

Although a preferred embodiment of the invention has been described for purposes of illustration, it should be understood that various changes, modification and substitutions may be incorporated in the embodiment without departing from the spirit of the invention which is defined by the claims which follow.

What is claimed is:

1. An electrical connection element for providing a ground connection between a printed circuit board and an electronic equipment chassis, comprising:

a connection element having a trough portion which fits around a side wall portion of the chassis and at least one spring contact assembly for removably receiving and holding the circuit board inserted thereinto, such that the circuit board can be inserted and removed by hand, wherein the connection element includes a portion thereof which is configured to be directly attached to the equipment chassis, and wherein insertion of the circuit board into the spring contact assembly results in a direct electrical connection between a circuit ground on the circuit board and the equipment chassis when the connection element is operatively attached to the equipment chassis.

2. The connection element of claim 1, wherein the connection element is permanently securable to the equipment chassis.

3. The connection element of claim 1, wherein the trough portion fits around a bottom edge of the side wall portion of the equipment chassis, so that when the equipment chassis is secured to the side wall portion, the connection element is captured therebetween.

4. The connection element of claim 1, wherein the spring contact assembly includes at least one elongated element with an ear portions near the top thereof, wherein the elongated element and the ear portion is configured so as to hold a printed circuit board in a spring pressure relationship.

5. The connection element of claim 3, wherein the trough portion includes two longitudinal side walls, with the spring contact assembly extending upwardly from one of the longitudinal side walls, and wherein the connection element further includes a small center tab which extends inwardly of the trough portion at an angle to the spring contact assembly, the tab being used to accurately locate the connection element relative to the equipment chassis by mating with a selected portion of the equipment chassis.

6. The connection element of claim 1, wherein a side wall of the trough portion from which the spring contact assembly extends angles inwardly from the trough portion, thereby providing a preload capability which presses the spring contact assembly against the equipment chassis side wall when the connection element is operatively installed in the equipment chassis.

7. The connection element of claim 1, wherein a bottom portion of the trough portion includes at least one small extension which makes an electrical contact between the connection element and the equipment chassis.

8. The connection element of claim 1, including a plurality of spring contact assemblies for receiving and holding the circuit board thereinto, wherein the spring contact assemblies are spaced so as to be in registry with circuit board guides on the side wall of the equipment chassis.

9. An electrical connection element for providing a ground connection between a printed circuit board and an electronic equipment chassis, comprising:

a connection element having at least one spring contact assembly including at least one elongated element with an ear portion near the top thereof for removably receiving and holding the circuit board inserted thereinto, such that the circuit board can be inserted and removed by hand, wherein the connection element includes a portion thereof which is configured to be directly attached to the equipment chassis, and wherein insertion of the circuit board into the spring contact assembly results in a direct electrical connection between a circuit ground on the circuit board and the equipment chassis when the connection element is operatively attached to the equipment chassis.

10. The connection element of claim 9, wherein the connection element is permanently securable to the equipment chassis.

11. The connection element of claim 9, wherein the connection element includes a trough portion which fits around a side wall portion of the equipment chassis, so that when the equipment chassis is secured to the side wall portion of the equipment chassis, the connection element is captured therebetween.

12. The connection element of claim 11, wherein the trough portion includes two longitudinal side walls, with the spring contact assembly extending upwardly from one of the longitudinal side walls, and wherein the connection element further includes a small center tab which extends inwardly of the trough portion at an angle to the spring contact assembly, the tab being used to accurately locate the connection element relative to the equipment chassis by mating with a selected portion of the equipment chassis.

13. The connection element of claim 12, wherein the side wall of the trough portion from which the spring contact assembly extends angles inwardly from the trough portion, thereby providing a preload capability which presses the spring contact assembly against the equipment chassis side wall when the connection element is operatively installed in the equipment chassis.

14. The connection element of claim 11, wherein a bottom portion of the trough portion includes at least one small extension which makes an electrical contact between the connection element and the equipment chassis.

15. The connection element of claim 9, including a plurality of spring contact assemblies for receiving and holding the circuit board thereinto, wherein the spring contact assemblies are spaced so as to be in registry with circuit board guides on the side wall of the equipment chassis.

* * * * *